United States Patent [19]

Griesenauer et al.

[11] 4,296,178
[45] Oct. 20, 1981

[54] ARTICLE COMPRISING A SUBSTRATE AND CHROMIUM ALLOY COATING

[75] Inventors: Neal M. Griesenauer, Grove City; Julius J. Gersi, Worthington, both of Ohio

[73] Assignee: Varian Associates, Inc., Palo Alto, Calif.

[21] Appl. No.: 40,356

[22] Filed: May 18, 1979

[51] Int. Cl.³ .............................................. C23C 15/00
[52] U.S. Cl. ..................................... 428/462; 428/457; 204/192 C
[58] Field of Search ................. 75/176; 428/457, 462; 204/192 C

[56] References Cited

U.S. PATENT DOCUMENTS

| 3,703,456 | 11/1972 | Cordes | 204/192 |
|---|---|---|---|
| 3,719,475 | 3/1973 | Cointe et al. | 75/126 D |
| 3,746,536 | 7/1973 | Kuse | 75/124 |
| 3,763,026 | 10/1973 | Cordes | 204/192 |
| 3,826,728 | 4/1974 | Chambers et al. | 204/192 |
| 3,911,579 | 10/1975 | Lane | 76/104 R |
| 3,984,907 | 10/1976 | Vossen | 428/457 |
| 4,004,080 | 1/1977 | Vossen | 75/171 X |
| 4,021,277 | 5/1977 | Shirn et al. | 204/192 R |
| 4,022,947 | 5/1977 | Grubb et al. | 428/432 |
| 4,131,530 | 12/1978 | Blum et al. | 204/192 C |

FOREIGN PATENT DOCUMENTS 2029266 12/1971 Fed. Rep. of Germany ........ 75/171

OTHER PUBLICATIONS

Beale et al., Thin Solid Films 54 (1978), p. 326.
Richman, Annu. Conf. Soc. Vac. Coaters., 18 (1975), pp. 142–148.
Chambers et al., Annu. Conf. Soc. Vac. Coaters, 14 (1971), pp. 13–21.

Primary Examiner—M. J. Andrews
Attorney, Agent, or Firm—Stanley Z. Cole; Leon F. Herbert

[57] ABSTRACT

A metal alloy for a thin film deposition process, an article coated with a thin film of the metal alloy and the method of thin film deposition coating of an article with the metal alloy is provided. The metal alloy consists of 78–97.5% Cr, 2–20% of at least one element selected from the group consisting of Mo, Ni and Co, and 0.5–2% of scavenger element selected from the group consisting of Al, B, Be, Ce, Hf, La, Nb, Nd, Si, Ta, Th, Ti, U, Y and Zr, all by weight. Two or more elements selected from the group of Mo, Ni and Co may be included in the metal alloy in the total proportion of 2–20% by weight. The deposition coating method may be either evaporation or sputtering.

10 Claims, 2 Drawing Figures

ARTICLE COMPRISING A SUBSTRATE AND CHROMIUM ALLOY COATING

BACKGROUND OF THE INVENTION

This invention relates to the general field of deposition coating of articles and more specifically relates to the vacuum evaporation or sputtering techniques for deposit of a particular metal alloy in a thin film on an article substrate.

Vacuum evaporation and sputtering techniques have been utilized to a substantial extent in the forming of relatively thin film metal coatings on substrates comprising articles having substantial decorative function. These techniques of depositing a thin film coating of a metal alloy to provide a bright, metallic surface finish have found substantial utilization in the automotive field in the coating of plastic components incorporated in the decorative portions of automotive vehicles. Utilization of such film coating techniques is not limited to the automotive industry nor are they limited to decorative articles. Many articles may be advantageously coated with a protective layer of a suitable metal alloy for both functional and decorative purposes.

In addition to obtaining the particularly pleasing decorative effect, the vacuum evaporation and sputter deposition techniques enable forming of a thin film on plastic parts to enhance their durability in many functional and utilitarian aspects. For example, many of the components formed from plastic and incorporated in automotive vehicles require a coating that not only functions for the decorative aesthetic purposes, but will also have particularly advantageous characteristics for abrasion resistance, resistance to discolorations or degradation as a consequence of ultraviolet radiation, resistance to corrosion effects and to also accommodate mechanical stresses that are induced by thermal differences.

Metal alloys have been developed for this specific purpose of effecting vacuum evaporation and sputter deposition of thin film coatings on plastic substrates as well as other materials. The metal alloys heretofore utilized in such thin film deposition techniques comprise a chromium base and include a substantial percentage component of iron. Chromium is the elemental material which imparts the desirable characteristics of color, brightness and hardness in an attempt to achieve the functional and utilitarian advantages of resistance to abrasion and corrosion.

SUMMARY OF THE INVENTION

This invention relates to a new metal alloy that is particularly advantageous for utilization in vacuum evaporation and sputter deposition techniques. This metal alloy includes chromium as a primary constituent thereof and includes one or more of elements selected from the group consisting of molybdenum, nickel and cobalt. Additionally, there are minor amounts of other elements which are incorporated to perform a scavenging function in the metal alloy during the course of the deposition process. The chromium is provided in a proportion that includes the range of 78-97.5% by weight and the element or elements selected from a group of molybdenum, cobalt and nickel being provided in the range of 2-20% by weight. The balance of the alloy composition includes one or more of the elements selected to perform the scavenging function and which elements may be selected from a group which includes the rare earth elements. Suitable scavenger elements for this alloy are Al, B, Be, Ce, Hf, La, Nb, Nd, Si, Ta, Th, Ti, U, Y and Zr which are included in total proportion of 0.5-2% by weight.

This invention also relates to the method of depositing the metal alloy on a suitable substrate. Specifically, the method is directed to utilization of vacuum evaporation or sputter deposition techniques.

Particular advantages and improvements obtained with this invention are the ability to form a highly decorative coating on substrates which may be formed from plastic materials such as ABS plastics and having advantageous functional and utilitarian attributes. Specifically, the metal alloy provided by this invention is capable of forming a coating having the desired brightness and optical reflectivity characteristics for the decorative function while retaining utilitarian advantages of toughness, ductility, adaptability to accommodate thermal stress and exhibiting substantial resistance to abrasion and corrosion. Another important attribute of the metal alloy and its deposition as a thin film by either of the two techniques is the ability to retain color, brightness and reflectivity through its inherent ability to resist degradation as a consequence of incident ultraviolet radiation to which such automotive parts are extensively subjected.

DESCRIPTION OF THE DRAWING FIGURES

DESCRIPTION OF THE PREFERRED EMBODIMENTS

It has been found that forming a metal alloy wherein the primary constituent is chromium and the other major constituent includes one or more of the elements selected from the group of molybdenum, cobalt or nickel, results in an alloy that can be advantageously utilized with standard deposition techniques for application of a thin film to articles of manufacture. For purposes of further description, articles of manufacture to be thus coated are generally as a substrate having a surface to be coated. The metal alloy of this invention has been found to possess highly desired characteristics as to many functional and utilitarian aspects that are important in the coating of substrates.

The metal alloy of this invention includes chromium which constitutes the primary ingredient and is represented in proportions by weight of at least 70% of the total weight and, preferably, is in the range of 78-97.5%. The other major constituent of this alloy is at least one of the elements selected from the group of elements consisting of molybdenum, cobalt and nickel and is represented within the range of 2-20%. Two or more of these elements may be selected from that group and included in a specific alloy. The ratios and proportions of each of those elements selected from the group of elements may be varied throughout the entire range of 2-20% of the total composition for such elements with the elements being included in any predetermined relative ratio to obtain a metal alloy of specific characteristics and attributes.

The remaining portion of the alloy includes one or more of the elements selected from the group consisting of Al, B, Be, Ce, Hf, La, Nb, Nd, Si, Ta, Th, Ti, U, Y and Zr. These elements, as well as other elements which can form a scavenging function, are included in sufficient amounts to react with quantities of nitrogen, oxygen, carbon and sulphur as well as other impurities that may be present in the materials and cannot be entirely eliminated. These scavenging elements react with those impurities to form a stable compound that will not subsequently react with the metal alloy in any deleterious manner so as to result in derrogation of the alloy's advantageous characteristics.

The metal alloy of this invention may be conveniently formed by well-known procedures, including arc melting and induction melting in a vacuum. Selected proportionate amounts of the constituent materials are provided as a charge for the specific melting apparatus that is to be utilized. These materials are melted into a suitable crucible or mold to form a cast ingot of predetermined dimensions when coated. Alternatively, powder metallurgy techniques may be utilized to form a solid unit of the metal alloy. With powder metallury, it is possible to more closely form the material into the desired configuration that is required for utilization in the selected thin film deposition apparatus and procedure.

Figure 1:
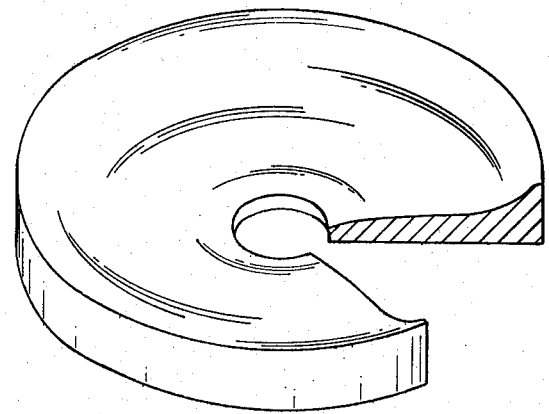
FIG. 1 is a perspective view of a sputtering target fabricated from the metal alloy of this invention.

Fabrication techniques for forming the metall alloy cast in an ingot cylindrical configuration into the predetermined configuration targets utilized in sputtering deposition is accomplished by machine operations. First, slices of the ingot are formed through cutting of the ingot transversely to the longitudinal axis, thereby providing cylindrical discs of desired thickness. Subsequent to cutting of the discs, those discs are then machined on one face to have a surface configuration similar to that which is illustrated in FIG. 1 of the drawings. These targets are generally formed with a central aperture. Fabrication of targets by this technique thus requires that the metal alloy have a suitable attribute of machinability. For complex surface configurations such that are often required for sputtering targets, it will be readily apparent that powder metallurgy techiques would be of substantial economic benefit since this metal alloy in certain of its included compositions is particularly tough and is difficult to machine.

Figure 2:
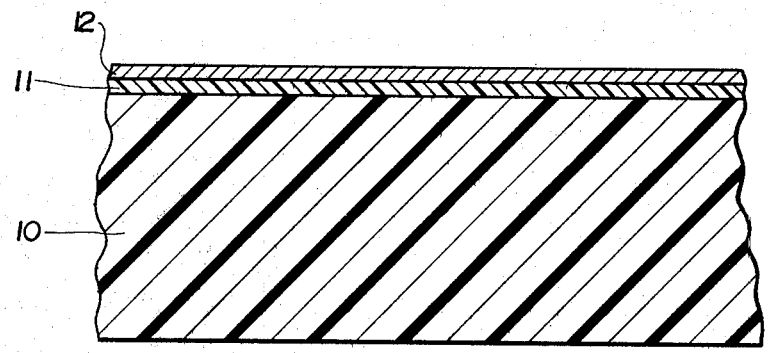
FIG. 2 is a cross-sectional view of a substrate coated with a thin film of the metal alloy of this invention.

Illustration of a resultant article formed by application of a thin film of the metal alloy of this invention to a substrate is provided in FIG. 2 of the drawings. The substrate 10 is shown as a flat plate formed from a plastic material such as that generally identified as ABS (acrylonitrile-butadiene-styrene) and frequently utilized for automotive vehicle components. A base coat[11] of a conventionally utilized material for this purpose is formed as a thin layer on the surface of the substrate to enhance the smoothness of the surface. A conventional or typical base coat is an organic layer such as that disclosed in Blum, U.S. Pat. No. 4,131,530. Next, a thin film[12] of the metal alloy is deposited on the base coated substrate by either evaporation or sputtering deposition techniques.

EXAMPLES

Test samples of the metal alloy embodying this invention were prepared and applied to actual portions of automotive grills formed from ABS plastic and to flat, sheet form test specimens. A sputtering deposition process was utilized in all instances of coating the articles.

A first example of metal alloy tested was formed with 96.5% Cr-3% Mo-0.5% Ti. A second example of metal alloy tested was formed with 91.5% Cr-8% Ni-0.5% Ti. Each of these alloy compositions were deposited on test articles or specimens in several different thicknesses which included 600, 1000, 1500 and 2000 angstroms. These test articles and specimens were then subjected to environmental tests including, as test parameters, humidity, thermocycle, salt spray and ultraviolet radiation. In each instance, the metal alloy coating which was deposited in a crack-free condition retained that condition throughout testing, thus indicating that the metal alloy of this invention exhibits satisfactory characteristics for use as a coating for substrates.

A third example of metal alloy was formed with 95.5% Cr-4% Co-0.5% Ti. A fourth example of metal alloy was formed with 91.5% Cr-8% Co-0.5% Ti.

The preceding examples of metal alloy composition, utilization thereof in thin film deposition process and the resultant articles are considered exemplary and not limitative on the scope of the invention or claims.

Having thus described this invention, what is claimed is:

1. An article comprising a substrate and a thin film metal alloy coating formed on a surface of said substrate by a process of depositing small particles on said substrate, said metal alloy consisting of 78–97.5% by weight of chromium, at least two elements selected from the group consisting of molybdenum, nickel and cobalt in the combined proportion of 2–20% by weight, and 0.5–2% by weight of a scavenger element.

2. An article according to claim 1 in which said metal alloy includes each of the three elements of the group consisting of molybdenum, nickel and cobalt and which are included in said metal alloy in the combined proportion of 2–20% by weight.

3. An article according to claim 1 wherein said 2–20% combined proportion includes 3% by weight of molybdenum.

4. An article according to claim 1 wherein said 2–20% combined proportion includes 8% by weight of nickel.

5. An article according to claim 1 wherein said 2–20% combined proportion includes 4% by weight of cobalt.

6. An article according to claim 1 wherein said 2–20% combined proportion includes 8% by weight of cobalt.

7. An article according to claim 1 wherein said scavenger element in said metal alloy includes at least one element selected from the group of elements consisting of Al, B, Be, Ce, Hf, La, Nb, Nd, Si, Ta, Th, U, Y and Zr.

8. An article according to claim 1 wherein said metal alloy includes 0.5% by weight of Ti as said scavenger element.

9. An article as claimed in claim 1 in which said substrate comprises a plastic.

10. An article according to claim 9 in which said plastic is ABS plastic.

* * * * *